(12) United States Patent
Rofougaran et al.

(10) Patent No.: US 8,106,829 B2
(45) Date of Patent: Jan. 31, 2012

(54) METHOD AND SYSTEM FOR AN INTEGRATED ANTENNA AND ANTENNA MANAGEMENT

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 844 days.

(21) Appl. No.: 11/954,748

(22) Filed: Dec. 12, 2007

(65) Prior Publication Data

US 2009/0153421 A1    Jun. 18, 2009

(51) Int. Cl.
*H01Q 1/38* (2006.01)
(52) U.S. Cl. ................................. 343/700 MS; 343/876
(58) Field of Classification Search ........... 343/700 MS, 343/876
See application file for complete search history.

(56) References Cited

U.S. PATENT DOCUMENTS

| | | | |
|---|---|---|---|
| 5,798,567 A | 8/1998 | Kelly et al. | |
| 6,060,433 A | 5/2000 | Li et al. | |
| 6,281,794 B1 * | 8/2001 | Duan et al. | 340/572.1 |
| 7,038,625 B1 | 5/2006 | Taylor et al. | |
| 7,145,509 B2 * | 12/2006 | Ikuta et al. | 343/700 MS |
| 7,247,932 B1 | 7/2007 | Lin et al. | |
| 7,880,677 B2 | 2/2011 | Rofougaran et al. | |
| 2004/0041732 A1 | 3/2004 | Aikawa et al. | |
| 2004/0150554 A1 | 8/2004 | Stenger et al. | |
| 2004/0201526 A1 * | 10/2004 | Knowles et al. | 343/700 MS |
| 2004/0222506 A1 | 11/2004 | Wei et al. | |
| 2005/0212642 A1 | 9/2005 | Pleskach et al. | |
| 2006/0033671 A1 | 2/2006 | Chan et al. | |
| 2006/0152911 A1 | 7/2006 | Humbert et al. | |
| 2006/0267717 A1 | 11/2006 | Posamentier | |
| 2007/0013051 A1 | 1/2007 | Heyan et al. | |
| 2007/0139112 A1 | 6/2007 | Bocock et al. | |
| 2007/0205748 A1 | 9/2007 | Abou | |
| 2008/0291115 A1 | 11/2008 | Doan et al. | |
| 2009/0153260 A1 | 6/2009 | Rofougaran | |
| 2009/0153427 A1 | 6/2009 | Rofougaran | |
| 2009/0156157 A1 | 6/2009 | Rofougaran et al. | |
| 2009/0179814 A1 | 7/2009 | Park et al. | |
| 2009/0189064 A1 | 7/2009 | Miller et al. | |
| 2009/0243741 A1 | 10/2009 | Rofougaran | |
| 2009/0243749 A1 | 10/2009 | Rofougaran | |
| 2009/0243767 A1 | 10/2009 | Rofougaran | |

FOREIGN PATENT DOCUMENTS

EP          1 146 592       10/2001
WO     WO 2007/114620      10/2007

* cited by examiner

*Primary Examiner* — Zandra Smith
*Assistant Examiner* — Telly Green
(74) *Attorney, Agent, or Firm* — Farjami & Farjami LLP

(57) ABSTRACT

Aspects of a method and system for an integrated antenna and antenna management are provided. In this regard, one or more reactances coupled to an antenna in a hybrid circuit may be tuned and signals may be transmitted and/or received based on the tuning. The hybrid circuit may comprise an integrated circuit (IC) bonded to a multi-layer package. The antenna may be embedded within and/or on the multi-layer package. The reactances may be within and/or on the IC and/or the multi-layer package. In this regard, the IC may be bonded to or mounted to an underside of the multi-layer package. The reactances may be tuned via one or more switching elements and/or logic, circuitry, and/or code within the IC. The reactances may comprise one or more inductors and/or capacitor arrays. The multi-layer package may comprise one or more layers of ferromagnetic and/or ferrimagnetic material.

21 Claims, 5 Drawing Sheets

METHOD AND SYSTEM FOR AN INTEGRATED ANTENNA AND ANTENNA MANAGEMENT

CROSS-REFERENCE TO RELATED APPLICATIONS/INCORPORATION BY REFERENCE

Not Applicable

FIELD OF THE INVENTION

Certain embodiments of the invention relate to signal processing. More specifically, certain embodiments of the invention relate to a method and system for integrated antenna and antenna management.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for an integrated antenna and antenna management, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for an integrated antenna and antenna management. In various exemplary embodiments of the invention, one or more reactances coupled to an antenna in a hybrid circuit may be tuned and signals may be transmitted and/or received based on the tuning. The hybrid circuit may comprise an integrated circuit (IC) bonded to a multi-layer package. The hybrid circuit may also be referred to as a hybridized circuit, or a hybrid or hybridized package. The antenna may be embedded within and/or on the multi-layer package. The reactances may be within and/or on the IC and/or the multi-layer package and signals to/from the reactances may be communicated between the IC and the multi-layer package via solder balls. In this regard, the IC may be bonded to or mounted to an underside of the multi-layer package. The reactances may be tuned via one or more switching elements and/or logic, circuitry, and/or code within the IC. The reactances may comprise one or more inductors and/or capacitor arrays. The multi-layer package may comprise one or more layers of ferromagnetic and/or ferrimagnetic material.

Figure 1A:
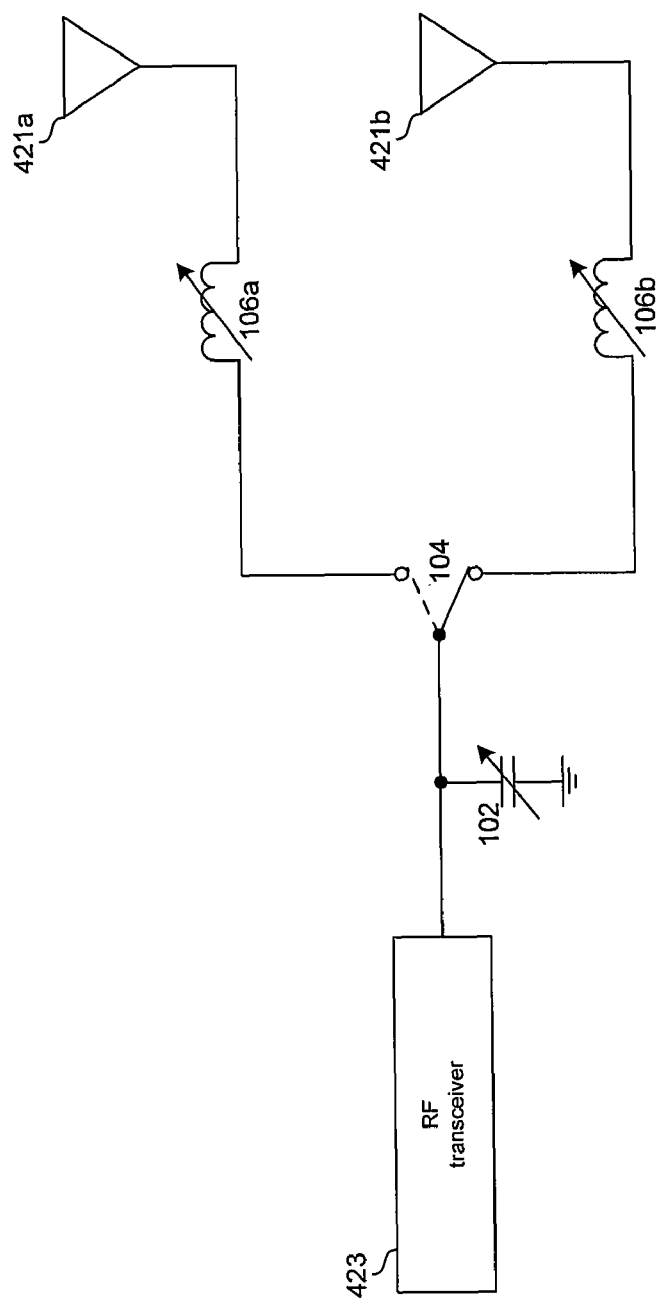
FIG. 1A is a diagram illustrating an exemplary integrated antenna management system, in accordance with an embodiment of the invention.

FIG. 1A is a diagram illustrating an exemplary integrated antenna management system, in accordance with an embodiment of the invention. Referring to FIG. 1a there is shown a transceiver 423, a variable capacitor 102, a switching element 104, variable inductors 106a and 106b, and antennas 421a and 421b.

The transceiver 423 may comprise suitable logic, circuitry, and/or code for transmitting and/or receiving RF signals. In this regard, the transceiver 423 may be as described below with respect to FIG. 4. Although a single transceiver 423 is shown, the invention is not so limited. Accordingly, a separate transmitter and receiver may be utilized without departing from the various aspects and scope of the invention.

The variable capacitor 102 may comprise, for example, a varactor or a bank of capacitors coupled via one or more switching elements. Accordingly, the capacitance of the variable capacitor may be controlled via one or more control signals from, for example, the baseband processor 429 and/or the processor 425 described with respect to FIG. 4. In this manner, tuning the capacitor may enable tuning a frequency response of the system such that signals in a desired frequency or frequency band may be received and/or transmitted.

The switching element 104 may comprise suitable logic, circuitry, and/or code that may enable selecting between antenna 421a and 421b. For example, antenna 421a may be utilized for transmitting and antenna 421b may be utilized for receiving. For another example, antenna 421a may be utilized for a first frequency band and antenna 421b may be utilized for a second frequency band.

The variable inductors 106a and 106b may comprise, for example, a bank of inductors coupled via one or more switching elements. Accordingly, the inductance of the variable inductors 106a and 106b may be controlled via one or more control signals. In this manner, tuning the variable inductors 106a and 106b may enable tuning a frequency response of the system such that signals in a desired frequency or frequency band may be received and/or transmitted.

In operation, the variable capacitor 102 and the inductors 106a and 106b may be adjusted to tune the frequency response of the system. In this manner, a wider range of frequencies may be transmitted and/or received than may be possible with only antennas and/or fixed components. In an exemplary embodiment of the invention, antenna 421a may be a receive antenna and antenna 421b may be a transmit antenna. Accordingly, the switch 104 may enable selecting between transmit and receive. Furthermore, time division multiplexing may be utilized to rapidly switch between antenna 421a and 421b such that apparent simultaneous transmission and reception may be achieved. In this regard, antenna 421a may receive for a portion of a time interval and antenna 421b may transmit for a remainder of the time interval. The time interval and the portion and the remainder may be chosen such that received signals are not missed while transmitting and transmitted signals are not interrupted while receiving.

In another embodiment of the invention, the antennas 421a and 421b may each be designed to transmit/receive different frequency bands. For example, antenna 421a combined with the tune range of the capacitor 102 and the inductor 106a may cover a first lower frequency band, and antenna 421b combined with the tune range of the capacitor 102 and the inductor 106b may cover a second higher frequency band. In this manner, the switching element 104 may enable selecting a frequency band.

Figure 1B:
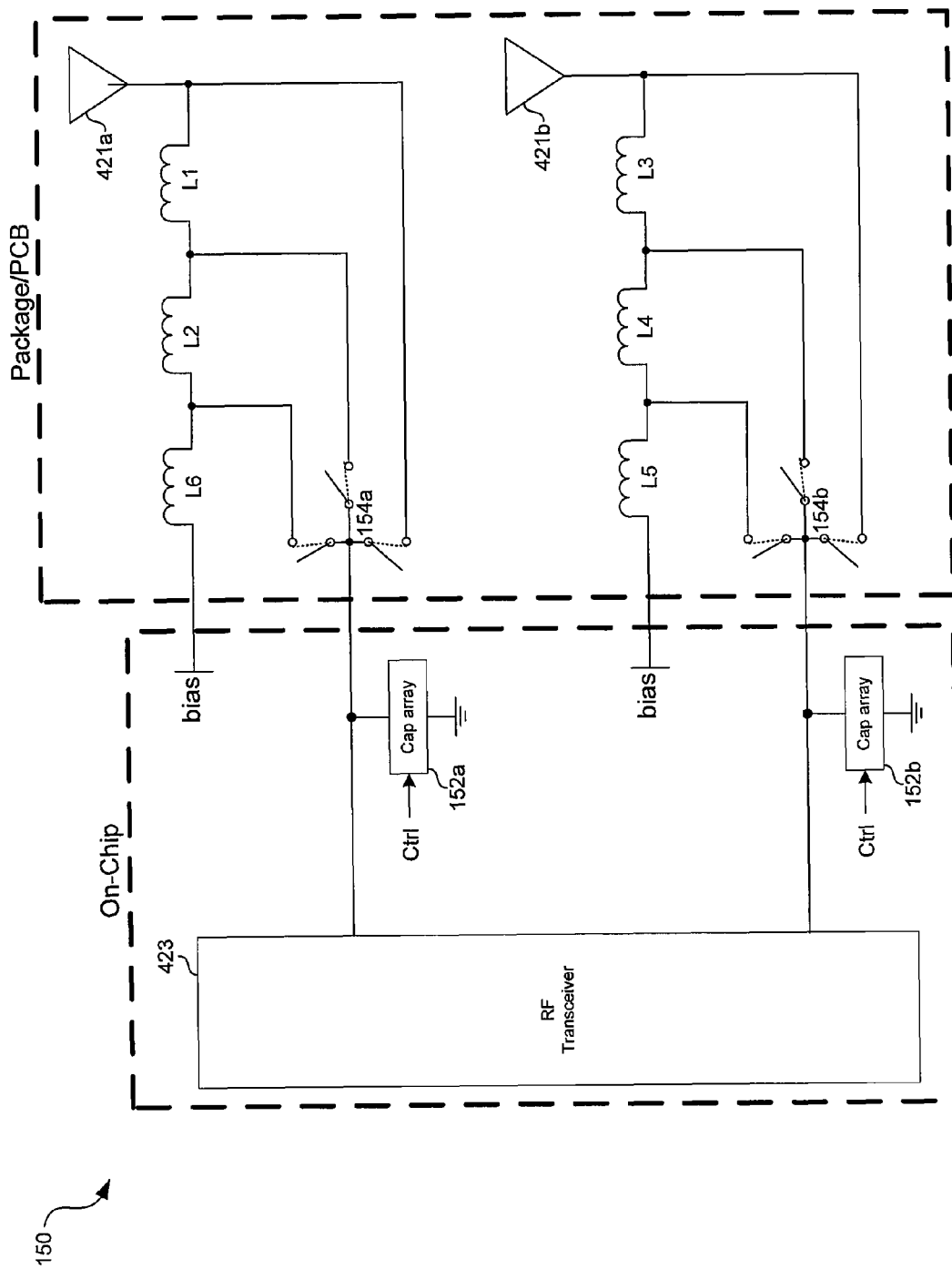
FIG. 1B is a diagram illustrating another exemplary integrated antenna management system, in accordance with an embodiment of the invention.

FIG. 1B is a diagram illustrating an exemplary implementation of an integrated antenna management system, in accordance with an embodiment of the invention. Referring to FIG. 1B there is shown a hybrid circuit 150 comprising a transceiver 423, capacitor arrays 152a and 152b, inductors L1, . . . , L6, switching elements 154a and 154b, and antennas 421a and 421b.

The transceiver 423 may comprise suitable logic, circuitry, and/or code for transmitting and/or receiving RF signals. In this regard, the transceiver 423 may be as described below with respect to FIG. 4.

The inductors L1, . . . , L6 may be fixed or variable value inductors fabricated in an multi-layer integrated circuit (IC) package. In this regard, the multi-layer IC package may be as described below with respect to FIG. 2. Inductors L1 and L2 may be chosen to be values suitable for transmitting and/or receiving desired frequencies via the antenna 421a. Similarly, the inductors L3 and L4 may be chosen to be values suitable for transmitting and/or receiving desired frequencies via the antenna 421b. The inductors L5 and L6 may act as AC blocks such that a bias voltage on the antenna may be maintained. In this regard, the inductors L5 and L6 may enable, for example, bleeding off charge that may accumulate on the antennas 421a and 421b, the inductors, and/or nodes coupled thereto.

The switching element 154a and 154b may comprise suitable logic, circuitry, and/or code that may enable selecting an inductance coupled, respectively, to antennas 421a and 421b. In FIG. 1C a closed switch is indicated by a dashed line and an open switch is indicated by a solid line. The switching element 154a may enable coupling the antenna 421a directly to the transceiver 423, coupling the antenna 421a to the transceiver 423 via the inductor L1, or coupling the antenna 421a to the transceiver 423 via the inductors L1 and L2. Similarly, the switching element 154b may enable coupling the antenna 421b directly to the transceiver 423, coupling the antenna 421b to the transceiver 423 via the inductor L3, or coupling the antenna 421b to the transceiver 423 via the inductors L3 and L4. In this manner, the inductance may be varied to tune a frequency response of the hybrid circuit 150. In various embodiments of the invention, the switching elements 154a and 154b may be micro-electro-mechanical (MEMS) switches and may be fabricated in the multi-layer IC package and/or in the IC. In various embodiments of the invention, the switching elements 154a and 154b may be active elements fabricated in an integrated circuit ("on-chip").

The capacitor arrays 152a and 152b may each comprise, for example, bank of capacitors coupled via one or more switching elements. Accordingly, the capacitance of the capacitor arrays 152a and 152b may be controlled via one or more control signals. In this manner, tuning the capacitance may enable tuning a frequency response of the hybrid circuit 150 such that signals in a desired frequency or frequency band may be received and/or transmitted. In various embodiments of the invention, capacitors in the arrays 152a and 152b may be in the IC, in the IC package, surface mount components on the package, surface mount components on a printed circuit board (PCB), or some combination thereof.

In operation, the capacitor arrays 152a and 152b may be adjusted to tune the frequency response of the hybrid circuit 150. Similarly, the switching elements 154a and 154b may be controlled to select the appropriate inductance. In this manner, a wider range of frequencies may be transmitted and/or received than may be possible with only antennas and/or fixed components. In an exemplary embodiment of the invention, antenna 421a may be a receive antenna and antenna 421b may be a transmit antenna. Accordingly, transceiver 423 may be enabled to transmit and receive simultaneously. In another embodiment of the invention, the antennas 421a and 421b may each be designed to transmit/receive different frequency bands. For example, antenna 421a combined with the tune range of the capacitor arrays 152a and the inductors L1 and L2 may cover a first frequency band, and antenna 421b combined with the tune range of the capacitor arrays 152b and the inductors L3 and L4 may cover a second frequency band. In this manner, the switching elements 154a and 154b may enable selecting a frequency band.

Figure 2:
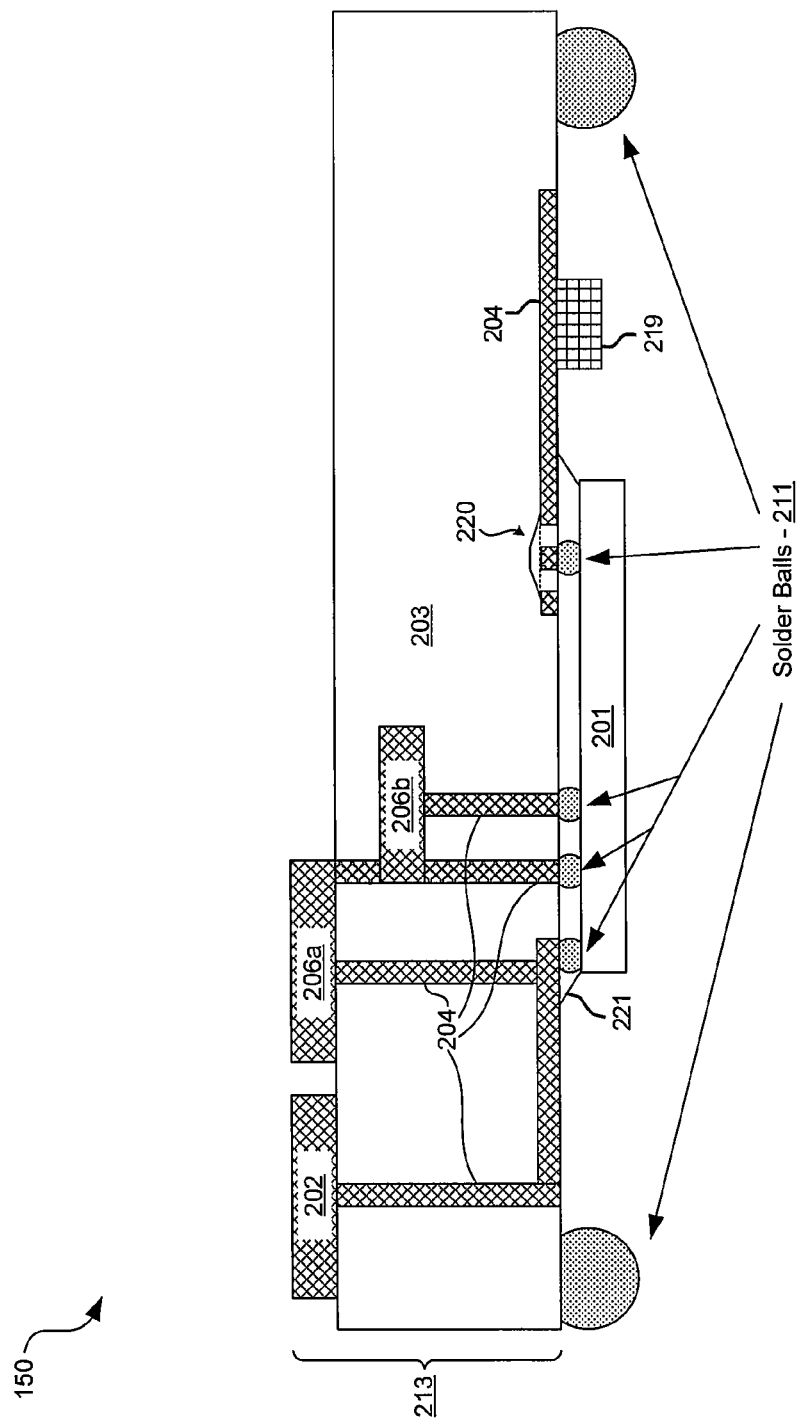
FIG. 2 is a diagram illustrating a cross sectional view of a multi-layer package with integrated components for antenna management, in accordance with an embodiment of the invention.

FIG. 2 is a diagram illustrating a cross sectional view of a multi-layer package with integrated components for antenna management, in accordance with an embodiment of the invention. Referring to FIG. 2, there is shown a hybrid circuit 150 comprising an integrated circuit (IC) (also referred to as a "chip") 201 and a multi-layer package 213. The multi-layer package 213 may comprise, an insulating material 203, metal layers 202, 204, 206, and a MEMS switch 220. The multi-layer package 213 may also comprise interconnect materials and, in various embodiments, one or more layers and or areas of ferromagnetic and/or ferromagnetic material. The IC 210 may be coupled to the package 213, and the package to a PCB (not shown), via solder balls 211. One or more surface mount components 219 may be mounted to the package 213, and thermal epoxy 221 may be pressed between the IC 201 and the package 213.

The IC 201 may comprise suitable logic, circuitry, and/or code such that the IC 201 and associated multi-layer package may be a "standardized" circuit element which may be coupled to a variety of devices (e.g., via one or more PCB traces). In this regard, the hybrid circuit 150 may comprise an input/output interface to which a device, such as the transceiver 423, may be coupled. Accordingly, the IC 201 may control one or more variable capacitances, inductances, and/or switching elements based on one or more control signals received via the input/output interface. Alternatively, in various embodiments of the invention, the IC 201 may comprise the transceiver 423, the processor 425, the memory 427, and/or the baseband processor 429 described with respect to FIG. 4.

The IC 201 may be bump-bonded or flip-chip bonded to the multi-layer package 213 utilizing the solder balls 211. In this manner, wire bonds connecting the IC 201 to the multi-layer package 213 may be eliminated, reducing and/or eliminating uncontrollable stray inductances due to wire bonds. In addition, the thermal conductance out of the IC 201 may be greatly improved utilizing the solder balls 211 and the thermal epoxy 221. The thermal epoxy 221 may be electrically insulating but thermally conductive to allow for thermal energy to be conducted out of the IC 201 to the much larger thermal mass of the multilayer package 213.

The solder balls 211 may comprise spherical balls of metal to provide electrical, thermal and physical contact between the IC 201 and the multi-layer package 213. In making the contact with the solder balls 211, the IC may be pressed with enough force to squash the metal spheres somewhat, and may be performed at an elevated temperature to provide suitable electrical resistance and physical bond strength. The solder balls 211 may also be utilized to provide electrical, thermal and physical contact between the multi-layer package 213 and a printed circuit board comprising other parts of, for example, the wireless system 420 described with respect to FIG. 4.

The surface mount devices 219A and 219B may comprise discrete circuit elements such as resistors, capacitors, inductors, and diodes, for example. The surface mount devices 219A and 219B may be soldered to the multi-layer package 213 to provide electrical contact.

In an exemplary embodiment of the invention, the metal layer 202, may comprise a deposited metal layer utilized to delineate one or more antennas (e.g., 421a of FIG. 1B). In this regard, the metal layer 202 may have a shape and/or size suited for receiving desired frequencies. Although, only a single antenna is depicted in FIG. 2, additional antennas may be fabricated in the package 213.

In an exemplary embodiment of the invention, the metal layers 206a and 206b, may comprise deposited metal layers utilized to delineate inductors (e.g., L1 and L2 of FIG. 1B). In this regard, the metal layers 206a and 206b may be spiral shaped transmission lines with a first terminal on the outer ring of the spiral and a second terminal at the center of the spiral. Although, only two inductors are depicted in FIG. 2, additional inductors may be fabricated in the package 213.

In an exemplary embodiment of the invention, the various metal layers may be interconnected and/or coupled to the solder balls 211 via metal 204. In this regard, metal 204 may comprise one or more metal layers and/or vias.

In an exemplary embodiment of the invention, one or more MEMS switches 220 may be realized in the multi-layer package 213 or in the IC 201. In this regard, the MEMS switch 220 may close when, for example a magnetic field is induced on a switch terminal. In this regard, the MEMS switches 220 may each comprise a thin conductive element or film which when in the open position is suspended above a switch terminal (as indicated by the solid lines in FIG. 2) and when in the closed position is in contact with a switch terminal (as indicated by the dashed lines in FIG. 2). Accordingly, energizing the terminal, for example, may generate an attracting force that draws the element of film into contact with the terminal.

In operation, the IC 201 and associated package 213 may be utilized to transmit and/or receive RF signals. The IC 201 may be electrically coupled to devices fabricated on and/or within the multi-layer package 213, such as antennas, inductors, transmission lines, capacitors, surface mount devices, etc. For example, signals received via the integrated antenna 202 may be coupled to the IC 201 via a first solder ball and to a first terminal of the inductor 206a. A second terminal of the inductor 106a may be coupled to the IC 201 via a second solder ball and to a first terminal of the inductor 106b. The second terminal of the inductor 106b may be coupled to the IC 201 via a third solder ball. In this manner, logic, circuitry, and/or code in the IC 201 may select whether to utilize the received signal from the first, second, or third input (solder ball). Accordingly, selecting the different inputs may correspond to different inductances through which the received signal is conveyed. In various embodiments of the invention, additional devices may be integrated into the multi-layer package without deviating from the scope of the present invention.

In an exemplary embodiment of the invention, one or more circuit values (e.g., capacitance or inductance) may be adjusted and/or tuned via the surface mount devices. For example, the MEMS switch 220 may enable coupling/decoupling the surface mount devices to the IC 210. In this regard, the surface mount devices may be capacitors in the capacitor arrays 152 described with respect to FIGS. 1B and 1C. In various other embodiments of the invention, additional MEMS switches may be integrated in the multi-layer package 213 and may be utilized for coupling/decoupling integrated and/or surface mount components within/on the multi-layer package to other components within/on the package 213 and/or to the IC 210. Additionally, switching elements in the IC 210 may be utilized for coupling devices within the IC 210, within the multi-layer package 213, and between the multi-layer package 213 and the IC 210. For example, capacitors and switches comprising the capacitor arrays 152 described with respect to FIGS. 1B and 1C may each be in the IC 210 and/or in the multi-layer package 213.

Figure 3:
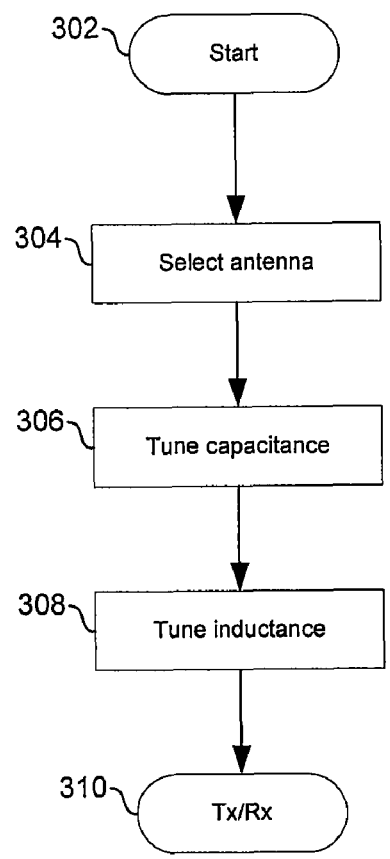
FIG. 3 is a flow chart illustrating exemplary steps for transmitting and/or receiving signals utilizing an integrated antenna and antenna management system, in accordance with an embodiment of the invention.

FIG. 3 is a flow chart illustrating exemplary steps for transmitting and/or receiving signals utilizing an integrated antenna and antenna management system, in accordance with an embodiment of the invention. Referring to FIG. 3, the exemplary steps may begin with step 302 when a system is ready to begin transmitting and/or receiving RF signals. Subsequent to step 302, the exemplary steps may advance to step 304. In step 304, an antenna may be selected for transmission and/or reception. In this regard, in various embodiments a plurality of antennas may be fabricated on an IC package and may be selected based on mode of transmission, mode of reception, desired frequency, etc. Accordingly, one or more switches (on-chip and/or in the IC package) may be controlled via one or more control signals. Subsequent to step 304, the exemplary steps may advance to step 306. In step 306, one or more capacitances may be tuned to adjust the frequency response of the system. In this regard, the system may be tuned to a desired transmit/receive frequency. Subsequent to step 306, the exemplary steps may advance to step 308. In step 308, one or more inductances may be tuned to adjust the frequency response of the system. In this regard, the system may be tuned to a desired transmit/receive frequency. Subsequent to step 308, the exemplary steps may advance to step 310. In step 310, the system may begin transmitting and/or receiving via the integrated antenna(s).

Figure 4:
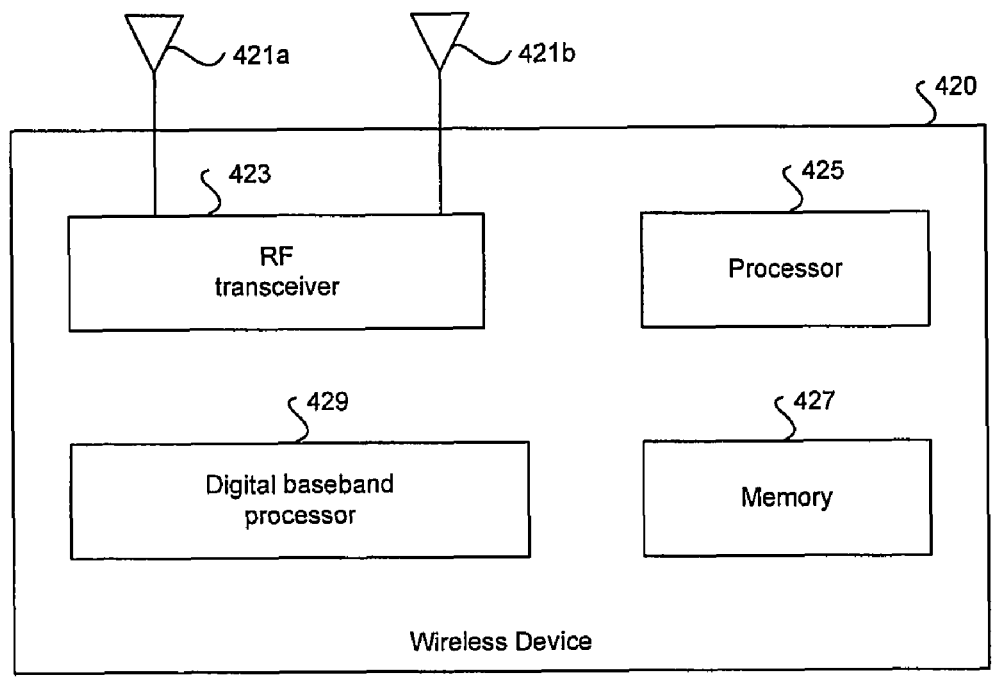
FIG. 4 is a block diagram illustrating an exemplary wireless device, in accordance with an embodiment of the invention.

FIG. 4 is a block diagram illustrating an exemplary wireless device, in accordance with an embodiment of the invention. Referring to FIG. 4, there is shown a wireless device 420 that may comprise an RF receiver 423a, an RF transmitter 423b, a digital baseband processor 429, a processor 425, and a memory 427. A receive antenna 421a may be communicatively coupled to the RF receiver 423a. A transmit antenna 421*b* may be communicatively coupled to the RF transmitter 423*b*. The wireless device 420 may be operated in a system, such as the cellular network and/or digital video broadcast network, for example. The wireless device 420 may comprise one or more hybrid circuits, such as the hybrid circuit described with respect to FIG. 1B.

The RF receiver 423*a* may comprise suitable logic, circuitry, and/or code that may enable processing of received RF signals. The RF receiver 423*a* may enable receiving RF signals in a plurality of frequency bands. For example, the RF receiver 423*a* may enable receiving signals in extremely high frequency (e.g., 60 GHz) bands. The receiver 423*a* may be as described with respect to FIG. 1A. In this regard, the receiver 423*a* may be enabled to receive, filter, amplify, down-convert, and/or perform analog to digital conversion. Moreover, voltage and/or current supplied to one or more components of the receiver 423*a* may be dynamically adjusted, and thus power efficiency of the receiver 423*a* may be improved over conventional receivers. In various embodiments of the invention, the wireless device 420 may comprise a plurality of the receivers 423*a* and may thus support, for example, multiple frequency bands and or simultaneous reception of multiple signals in the same frequency band.

The RF receiver 423*a* may down convert a received RF signal. Fore example, the RF receiver 423*a* may perform direct down conversion of the received RF signal to a baseband or may convert the received RF signal to an intermediate frequency (IF). In various embodiments of the invention, the receiver 423*a* may perform quadrature down-conversion where in-phase components and quadrature phase components may be processed in parallel.

The digital baseband processor 429 may comprise suitable logic, circuitry, and/or code that may enable processing and/or handling of baseband signals. In this regard, the digital baseband processor 429 may process or handle signals received from the RF receiver 423*a* and/or signals to be transferred to the RF transmitter 423*b*, when the RF transmitter 423*b* is present, for transmission to the network. The digital baseband processor 429 may also provide control and/or feedback information to the RF receiver 423*a* and to the RF transmitter 423*b* based on information from the processed signals. In this regard, the baseband processor 429 may provide a control signal to one or more of SSI 104, the LNA 110, the mixer 112, the filter 114 (and possibly 106 and 108), the regulator(s) 118, and/or the ADC 116. The digital baseband processor 429 may communicate information and/or data from the processed signals to the processor 425 and/or to the memory 427. Moreover, the digital baseband processor 429 may receive information from the processor 425 and/or to the memory 427, which may be processed and transferred to the RF transmitter 423*b* for transmission to the network.

The RF transmitter 423*b* may comprise suitable logic, circuitry, and/or code that may enable processing of RF signals for transmission. The RF transmitter 423*b* may enable transmission of RF signals in a plurality of frequency bands. For example, the RF transmitter 423*b* may enable transmitting signals in cellular frequency bands. Each frequency band supported by the RF transmitter 423*b* may have a corresponding front-end circuit for handling amplification and up conversion operations, for example. In this regard, the RF transmitter 423*b* may be referred to as a multi-band transmitter when it supports more than one frequency band. In another embodiment of the invention, the wireless device 420 may comprise more than one RF transmitter 423*b*, wherein each of the RF transmitter 423*b* may be a single-band or a multi-band transmitter.

In various embodiments of the invention, the RF transmitter 423*b* may perform direct up conversion of the baseband signal to an RF signal. In some instances, the RF transmitter 423*b* may enable digital-to-analog conversion of the baseband signal components received from the digital baseband processor 429 before up conversion. In other instances, the RF transmitter 423*b* may receive baseband signal components in analog form.

The processor 425 may comprise suitable logic, circuitry, and/or code that may enable control and/or data processing operations for the wireless device 420. The processor 425 may be utilized to control at least a portion of the RF receiver 423*a*, the RF transmitter 423*b*, the digital baseband processor 429, and/or the memory 427. In this regard, the processor 425 may generate at least one signal for controlling operations within the wireless device 420. In this regard, the baseband processor 429 may provide a control signal to one or more of SSI 104, the LNA 110, the mixer 112, the filter 114 (and possibly 106 and 108), the regulator(s) 118, and/or the ADC 116. The processor 425 may also enable executing of applications that may be utilized by the wireless device 420. For example, the processor 425 may execute applications that may enable displaying and/or interacting with content received via cellular transmission signals in the wireless device 420.

The memory 427 may comprise suitable logic, circuitry, and/or code that may enable storage of data and/or other information utilized by the wireless device 420. For example, the memory 427 may be utilized for storing processed data generated by the digital baseband processor 429 and/or the processor 425. The memory 427 may also be utilized to store information, such as configuration information, that may be utilized to control the operation of at least one block in the wireless device 420. For example, the memory 427 may comprise information necessary to configure the RF receiver 423*a* to enable receiving signals at various signal levels and in the presence of varying amounts of interference. In this regard, the baseband processor may store control and/or configuration information for one or more of the SSI 104, the LNA 110, the mixer 112, the filter 114 (and possibly 106 and 108), the regulator(s) 118, and/or the ADC 116.

Exemplary aspects of a method and system for integrated antenna and antenna management may comprise, tuning one or more reactances coupled to an antenna (e.g., antenna 421*a* or 421*b* of FIG. 1B) in a hybrid circuit (e.g., 150 of FIG. 1B). Signals may be transmitted and/or received via the antenna based on the tuning. The hybrid circuits may comprise an integrated circuit (IC) (e.g., 201 of FIG. 2) bonded to a multi-layer package (e.g., 213 of FIG. 2). The antenna (e.g., 202 of FIG. 2) may be embedded within and/or on the multi-layer package. The reactances may be within and/or on the IC and/or on the multi-layer package and signals to/from the reactances may be communicated between the IC and the multi-layer package via solder balls (e.g., 211 of FIG. 2). In one embodiment of the invention, the IC may be bonded to or mounted to an underside of the multi-layer package. The reactances may be tuned via one or more switching elements (e.g., 220 of FIG. 2) and/or logic, circuitry, and/or code within the IC. The reactances may comprise one or more inductors (e.g., inductors L1, . . . L4 of FIG. 1B) and/or capacitor arrays (e.g., 152 of FIG. 1B). The multi-layer package may comprise one or more layers of ferromagnetic and/or ferrimagnetic material.

Another embodiment of the invention may provide a machine-readable storage, having stored thereon, a computer program having at least one code section executable by a machine, thereby causing the machine to perform the steps as described herein for integrated antenna and antenna management.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising: in a hybrid circuit comprising an integrated circuit bonded to a multi-layer integrated circuit package and comprising a plurality of inductors in one or more layers of said multi-layer integrated circuit package:
    selecting which one or more of said plurality of inductors are coupled in series with an antenna; and
    transmitting and/or receiving signals via said antenna and said selected one or more of said plurality of inductors, wherein said selecting is based on a frequency of said signals.

2. The method according to claim 1, wherein: one or more of said plurality of inductors in said one or more layers of said multi-layer integrated circuit package are coupled to a bias voltage.

3. The method according to claim 2, wherein said plurality of inductors in said one or more layers of said multi-layer integrated circuit package are coupled to said integrated circuit via one or more solder balls.

4. The method according to claim 3, wherein said integrated circuit is mounted to an underside of said multi-layer integrated circuit package.

5. The method according to claim 4, comprising selecting said one or more of said inductors via logic, circuitry, and/or code within said integrated circuit.

6. The method according to claim 1, comprising selecting said one or more of said inductors via one or more switching elements.

7. The method according to claim 6, wherein said switching elements comprise a micro-electro-mechanical systems (MEMS) switch in and/or on said integrated circuit and/or in said one or more layers of multi-layer integrated circuit package.

8. The method according to claim 1, wherein one or more tunable capacitors are in and/or on said integrated circuit and/or in said one or more layers of said multi-layer integrated circuit package.

9. The method according to claim 8, wherein said tunable capacitors comprise one or more capacitor arrays.

10. The method according to claim 1, wherein said multi-layer integrated circuit package comprises one or more layers of ferromagnetic and/or ferrimagnetic material.

11. The method according to claim 1, wherein said antenna is in said one or more layers of said multi-layer integrated circuit package.

12. A system for signal processing, the system comprising: a hybrid circuit comprising a multi-layer integrated circuit bonded to a multi-layer integrated circuit package and comprising a plurality of inductors in one or more layers of said multi-layer integrated circuit package;
    said hybrid circuit being enabled to select which one or more of said plurality of inductors are coupled in series with an antenna; and
    said hybrid circuit being enabled to transmit and/or receive signals via said antenna and said selected one or more of said plurality of inductors, wherein said selecting is based on a frequency of said signals.

13. The system according to claim 12, wherein one or more of said plurality of inductors in said one or more layers of said multi-layer integrated circuit package are coupled to a bias voltage.

14. The system according to claim 13, wherein said integrated circuit is mounted to an underside of said multi-layer integrated circuit package.

15. The system according to claim 14, wherein said one or more inductors are selected via logic, circuitry, and/or code within said integrated circuit.

16. The system according to claim 12, wherein said one or more inductors are selected via one or more switching elements.

17. The system according to claim 16, wherein said switching elements comprise a micro-electro-mechanical systems (MEMS) switch in and/or on said integrated circuit and/or in said one or more layers of multi-layer integrated circuit package.

18. The system according to claim 12, wherein one or more tunable capacitors are in and/or on said integrated circuit in said one or more layers of and/or said multi-layer integrated circuit package.

19. The system according to claim 12, wherein said multi-layer integrated circuit package comprises one or more layers of ferromagnetic and/or ferrimagnetic material.

20. The system according to claim 12, wherein said antenna is in said one or more layers of said multi-layer integrated circuit package.

21. A system, comprising:
    a multi-layer integrated circuit bonded to a multi-layer integrated circuit package;
    a plurality of inductors in one or more layers of the multi-layer integrated circuit package;
    one or more variable capacitors in the multi-layer integrated circuit;
    a plurality of switching elements in the multi-layer integrated circuit package; and
    an antenna, wherein:
        the switching elements are configurable, during operation of the multi-layer integrated circuit, to select which one or more of the plurality of inductors are coupled in series with the antenna; and
        the selection is based on a frequency of signals to be transmitted and/or received via the antenna and the selected one or more of the plurality of inductors.

* * * * *